(12) United States Patent
Sasaki et al.

(10) Patent No.: US 8,038,794 B2
(45) Date of Patent: Oct. 18, 2011

(54) GROUP III-NITRIDE CRYSTAL, MANUFACTURING METHOD THEREOF, GROUP III-NITRIDE CRYSTAL SUBSTRATE AND SEMICONDUCTOR DEVICE

(75) Inventors: Takatomo Sasaki, Suita (JP); Yusuke Mori, Katano (JP); Masashi Yoshimura, Takarazuka (JP); Fumio Kawamura, Minoh (JP); Seiji Nakahata, Itami (JP); Ryu Hirota, Itami (JP)

(73) Assignees: Sumitomo Electric Industries, Ltd., Osaka (JP); Yusuke Mori, Osaka (JP)

( * ) Notice: Subject to any disclaimer, the term of this patent is extended or adjusted under 35 U.S.C. 154(b) by 1219 days.

(21) Appl. No.: 11/628,253

(22) PCT Filed: Apr. 15, 2005

(86) PCT No.: PCT/JP2005/007316
§ 371 (c)(1),
(2), (4) Date: Dec. 1, 2006

(87) PCT Pub. No.: WO2005/121418
PCT Pub. Date: Dec. 22, 2005

(65) Prior Publication Data
US 2008/0022921 A1    Jan. 31, 2008

(30) Foreign Application Priority Data

Jun. 9, 2004 (JP) .................. 2004-171452

(51) Int. Cl.
*C30B 29/38* (2006.01)
(52) U.S. Cl. ............ 117/87; 117/45; 117/50; 117/54; 117/75; 117/78

(58) Field of Classification Search .............. 117/75–87, 117/45, 50, 54
See application file for complete search history.

(56) References Cited

U.S. PATENT DOCUMENTS 6,086,673 A * 7/2000 Molnar ................... 117/90
(Continued)

FOREIGN PATENT DOCUMENTS

EP    1 405 936 A    4/2004
(Continued)

OTHER PUBLICATIONS

Isamu Akasaki ed., "Group III-Nitride Semiconductor" first edition, Kabushiki Kaisha Baifukan, Dec. 1999, pp. 113-125.

(Continued)

*Primary Examiner* — Bob M Kunemund
(74) *Attorney, Agent, or Firm* — McDermott Will & Emery LLP

(57) ABSTRACT

A method of manufacturing a group III-nitride crystal substrate including the steps of introducing an alkali-metal-element-containing substance, a group III-element-containing substance and a nitrogen-element-containing substance into a reactor, forming a melt containing at least the alkali metal element, the group III-element and the nitrogen element in the reactor, and growing group III-nitride crystal from the melt, and characterized by handling the alkali-metal-element-containing substance in a drying container in which moisture concentration is controlled to at most 1.0 ppm at least in the step of introducing the alkali-metal-element-containing substance into the reactor is provided. A group III-nitride crystal substrate attaining a small absorption coefficient and the method of manufacturing the same, as well as a group III-nitride semiconductor device can thus be provided.

6 Claims, 4 Drawing Sheets

U.S. PATENT DOCUMENTS

| | | | |
|---|---|---|---|
| 6,270,569 B1* | 8/2001 | Shibata et al. | 117/68 |
| 6,348,096 B1 | 2/2002 | Sunakawa et al. | |
| 6,555,845 B2 | 4/2003 | Sunakawa et al. | |
| 6,596,079 B1* | 7/2003 | Vaudo et al. | 117/97 |
| 7,125,801 B2* | 10/2006 | Minemoto et al. | 438/691 |
| 7,221,037 B2* | 5/2007 | Kitaoka et al. | 257/615 |
| 7,227,172 B2* | 6/2007 | Kitaoka et al. | 257/11 |
| 7,294,199 B2* | 11/2007 | Uematsu et al. | 117/78 |
| 7,309,534 B2* | 12/2007 | Kitaoka et al. | 428/698 |
| 2002/0155634 A1 | 10/2002 | D'Evelyn et al. | |
| 2003/0012874 A1* | 1/2003 | Lange et al. | 427/240 |
| 2003/0015794 A1* | 1/2003 | Chang et al. | 257/744 |
| 2003/0155575 A1* | 8/2003 | Shibata et al. | 257/79 |
| 2003/0164138 A1* | 9/2003 | Sarayama et al. | 117/84 |
| 2004/0144300 A1* | 7/2004 | Kitaoka et al. | 117/2 |
| 2004/0147096 A1* | 7/2004 | Kitaoka et al. | 438/483 |
| 2004/0183090 A1* | 9/2004 | Kitaoka et al. | 257/103 |
| 2004/0262630 A1* | 12/2004 | Kitaoka et al. | 257/189 |
| 2005/0000406 A1* | 1/2005 | Janzen et al. | 117/81 |
| 2005/0011432 A1* | 1/2005 | Kitaoka et al. | 117/54 |
| 2005/0082564 A1* | 4/2005 | Kitaoka et al. | 257/103 |
| 2005/0133798 A1* | 6/2005 | Jung et al. | 257/79 |
| 2005/0164419 A1* | 7/2005 | Hirota et al. | 438/46 |
| 2005/0217565 A1* | 10/2005 | Lahreche et al. | 117/84 |
| 2005/0277214 A1* | 12/2005 | Uematsu et al. | 438/22 |
| 2006/0054076 A1 | 3/2006 | Dwilinski et al. | |
| 2006/0169197 A1* | 8/2006 | Sasaki et al. | 117/2 |
| 2007/0187700 A1* | 8/2007 | Kitaoka et al. | 257/79 |
| 2007/0196942 A1* | 8/2007 | Kitaoka et al. | 438/46 |
| 2007/0272941 A1* | 11/2007 | Minemoto et al. | 257/103 |
| 2007/0296061 A1* | 12/2007 | Sasaki et al. | 257/615 |
| 2008/0022921 A1* | 1/2008 | Sasaki et al. | 117/11 |
| 2008/0081015 A1* | 4/2008 | Sarayama et al. | 423/409 |
| 2008/0118648 A1* | 5/2008 | Friedrich et al. | 427/376.1 |
| 2008/0149020 A1* | 6/2008 | Janzen et al. | 117/89 |
| 2008/0282978 A1* | 11/2008 | Butcher et al. | 118/715 |
| 2008/0296626 A1* | 12/2008 | Haskell et al. | 257/200 |
| 2008/0308908 A1* | 12/2008 | Otake | 257/615 |
| 2009/0000542 A1* | 1/2009 | Iwai et al. | 117/206 |
| 2010/0001289 A1* | 1/2010 | Frayssinet et al. | 257/76 |
| 2010/0015787 A1* | 1/2010 | Yu et al. | 438/483 |
| 2010/0032718 A1* | 2/2010 | Yu et al. | 257/200 |
| 2010/0035416 A1* | 2/2010 | Chen et al. | 438/481 |
| 2010/0044719 A1* | 2/2010 | Yu et al. | 257/76 |
| 2010/0059717 A1* | 3/2010 | Mori et al. | 252/506 |

FOREIGN PATENT DOCUMENTS

| | | |
|---|---|---|
| EP | 1 772 540 A | 4/2007 |
| JP | 10-312971 | 11/1998 |
| JP | 11-130597 | 5/1999 |
| JP | 3139445 | 12/2000 |
| JP | 2002-241112 A | 8/2002 |
| JP | 2004-35360 | 2/2004 |
| JP | 2004-119423 | 4/2004 |
| JP | 2004-158500 | 6/2004 |
| WO | WO 03/098708 A1 | 11/2003 |

OTHER PUBLICATIONS

Isamu Akasaki ed., "Group III-Nitride Semiconductor" first edition, Kabushiki Kaisha Baifukan, Dec. 1999, pp. 122-124.

F. Kawamura et al., "Growth of a Large GaN Single Crystal Using the Liquid Phase Epitaxy (LPE) Technique," Japanese Journal of Applied Physics, Japan Society of Applied Physics, vol. 42, No. 1A/B, Part 02, Jan. 15, 2003, pp. L04-L06.

European Search Report issued in European Patent Application No. EP 05 73 0635.9 dated Sep. 14, 2009.

Japanese Notice of Grounds of Rejection, w/ English translation thereof, issued in Japanese Patent Application No. JP 2004-171452 dated Oct. 26, 2010.

Japanese Notice of Grounds of Rejection, with English Translation, issued in Japanese Patent Application No. 2004-171452, mailed Mar. 15, 2011.

* cited by examiner

GROUP III-NITRIDE CRYSTAL, MANUFACTURING METHOD THEREOF, GROUP III-NITRIDE CRYSTAL SUBSTRATE AND SEMICONDUCTOR DEVICE

RELATED APPLICATIONS

This application is the U.S. National Phase under 35 U.S.C §371 of International Application No. PCT/JP2005/007316, filed on Apr. 15, 2005, which in turn claims the benefit of JP 2004-171452, filed Jun. 9, 2004, the disclosures of which Applications are incorporated by reference herein.

TECHNICAL FIELD

The present invention relates to a group III-nitride crystal having low dislocation density and manufacturing method thereof, as well as to a group III-nitride crystal substrate and a semiconductor device.

Background Art

Conventionally, in a method of manufacturing a group III-nitride crystal such as GaN crystal or AlN crystal, a group III-nitride substrate of the same type as the group III-nitride crystal to be grown, or a different type, sapphire substrate, an SiC substrate or the like has been used as a seed crystal, and the group III-nitride crystal is grown from a widest surface (hereinafter referred to as a main surface) of the seed crystal in a direction vertical to the surface. Therefore, dislocations taken over from the seed crystal propagate as penetrating dislocations, in the direction vertical to the main surface.

When the group III-nitride crystal manufactured by the above-described manufacturing method is used as a substrate for manufacturing a semiconductor device such as an optical device or an electronic device, the penetrating dislocations existing in the main surface of the group III-nitride crystal make shorter the life of the optical device and increase leakage current of the electronic device, degrading performance of the semiconductor device.

In order to reduce penetrating dislocations in the main surface of group III-nitride crystal, a method such as ELO (Epitaxial Lateral Overgrowth) has been proposed (for example, in Japanese Patent No. 3139445 (Patent Document 1) and in Isamu AKASAKI ed., *Group III-Nitride Semiconductor*, first edition, Kabushiki Kaisha Baifukan, December 1999, pp. 122-124 (Non-Patent Document 1)), in which the crystal is locally grown in the lateral direction at a plurality of portions on the main surface of the seed crystal.

The ELO method described above, however, requires the steps of forming a mask, photolithography and etching, resulting in high cost. Further, this is a method of collecting dislocations locally on the main surface of the seed crystal to reduce the number of dislocations at other portions, and therefore, the effect of reducing dislocations is not always sufficient.

Patent Document 1: Patent No. 3139445
Non-Patent Document 1: Isamu AKASAKI ed., *Group III-Nitride Semiconductor*, first edition, Kabushiki Kaisha Baifukan, December 1999, pp. 122-124

DISCLOSURE OF THE INVENTION

Problem to be Solved by the Invention

An object of the present invention is to provide a group III-nitride crystal having low dislocation density by reducing dislocations taken over from a seed crystal, a method of manufacturing the same, a group III-nitride crystal substrate and a semiconductor device obtained from the group III-nitride crystal.

Means to Solve the Problem

According to an aspect, the present invention provides a method of manufacturing a group III-nitride crystal, including the steps of: preparing a seed crystal, and growing a first group III-nitride crystal on the seed crystal by liquid phase method; wherein in the step of growing a first group III-nitride crystal on the seed crystal, rate of crystal growth in a direction parallel to a main surface of the seed crystal is higher than rate of crystal growth in a direction vertical to the main surface of the seed crystal.

The method of manufacturing a group III-nitride crystal of the present invention further includes the step of growing a second group III-nitride crystal on the first group III-nitride crystal; wherein in the step of growing a second group III-nitride crystal on the first group III-nitride crystal, rate of crystal growth in a direction parallel to a main surface of the seed crystal is lower than rate of crystal growth in a direction vertical to the main surface of the seed crystal. Further, the step of growing the second group III-nitride crystal on the first group III-nitride crystal may be performed by liquid phase method or gas phase method.

Further, in the method of manufacturing a group III-nitride crystal of the present invention, the seed crystal may be a group III-nitride seed crystal or a group III-nitride seed crystal formed on an underlying substrate. Further, the main surface of the group III-nitride seed crystal may be a {0001} plane.

According to another aspect, the present invention provides a group III-nitride crystal manufactured through the above-described method of manufacturing a group III-nitride crystal, wherein dislocation density of a surface parallel to the main surface of the seed crystal is at most $5 \times 10^6 / cm^2$.

According to a further aspect, the present invention provides a group III-nitride crystal substrate obtained from the group III-nitride crystal described above, of which dislocation density of the main surface is at most $5 \times 10^6 / cm^2$.

According to a still further aspect, the present invention provides a semiconductor device having at least one group III-nitride semiconductor layer, on a main surface of the group III-nitride crystal substrate described above.

Effect of the Invention

As described above, according to the present invention, dislocations taken over from the seed crystal can be reduced, and therefore, a group III-nitride crystal having low dislocation density and manufacturing method thereof, as well as a group III-nitride crystal substrate and a semiconductor device obtained from the group III-nitride crystal can be provided.

Figure 1:
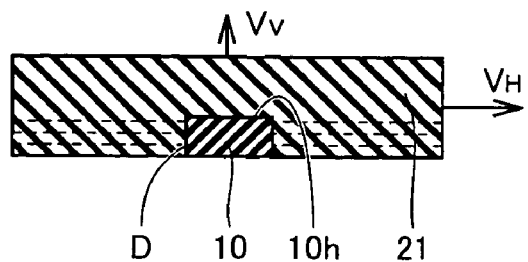
FIG. 1 is a schematic cross sectional view showing the step of growing a first group III-nitride crystal on a seed crystal.

DESCRIPTION OF THE REFERENCE CHARACTERS 1 reaction vessel, 8 support base, 9 underlying layer, 10 seed crystal, 10h main surface, 20 group III-nitride crystal, 21 first group III-nitride crystal, 22 second group III-nitride crystal, 30 melt, 40 nitrogen raw material gas, 70 GaN crystal substrate, 71 n type GaN layer, 72 multiple quantum well structure, 73 p type $Al_{0.20}Ga_{0.80}N$ layer, 74 p type GaN layer, 75 p-side electrode, 76 n-side electrode, 80 emission.

BEST MODES FOR CARRYING OUT THE INVENTION

Embodiment 1

Referring to FIG. 1, a method of manufacturing a group III-nitride crystal in accordance with the present invention includes the steps of preparing a seed crystal 10, and growing a first group III-nitride crystal 21 on seed crystal 10 by liquid phase method, and the step of growing a first group III-nitride crystal 21 on seed crystal 10 is characterized in that the rate of crystal growth $V_H$ in a direction parallel to the main surface 10h of seed crystal 10 is larger than the rate of crystal growth $V_V$ in a direction vertical to the main surface 10h of seed crystal 10.

In the step of growing the first group III-nitride crystal 21, as $V_H > V_V$, most of the dislocations D on the surface of seed crystal 10 propagate in a direction parallel to the main surface of the seed crystal, and hardly propagate in a direction vertical to the main surface 10h of seed crystal 10. Therefore, in the grown first group III-nitride crystal 21, dislocation density of the surface parallel to the main surface 10h of seed crystal 10 is significantly reduced from the dislocation density of the main surface 10h of seed crystal 10.

From the viewpoint of suppressing generation of dislocations at the interface between the seed crystal and the group III-nitride crystal to be grown thereon, preferably, a group III-nitride crystal is preferred as the seed crystal and a group III-nitride crystal of the same type as the group III-nitride crystal to be grown is more preferred, though not limiting. For instance, as a seed crystal for growing a GaN crystal, group III-nitride crystal such as a GaN seed crystal or AlN seed crystal is preferred, and particularly, a GaN seed crystal is preferred.

Though not limiting, as the liquid phase method, use of the flux method or high nitrogen ($N_2$) pressure solution method is preferred, in order to easily grow the first group III-nitride crystal having low dislocation density.

Here, in the flux method, a group III-nitride crystal is grown with nitrogen dissolved in a melt containing a group III-element and flux, at a temperature of about 600 to about 1400° C. and pressure of about 0.1 MPa to about 10 MPa. An alkali metal element or a transition metal element is used as the flux. By way of example, when the group III-element is Ga, Na as an alkali metal element is preferably used, and when the group III-element is Al, Fe, Mn or Cr as a transition metal element is preferably used. In the high nitrogen pressure solution method, a group III-nitride crystal (for example, GaN crystal) is grown with nitrogen dissolved in a melt of a group III-element (for example, Ga melt) at a high temperature of about 1500° C. under high $N_2$ pressure of about 1 GPa to about 2 GPa.

Embodiment 2

Figure 2:
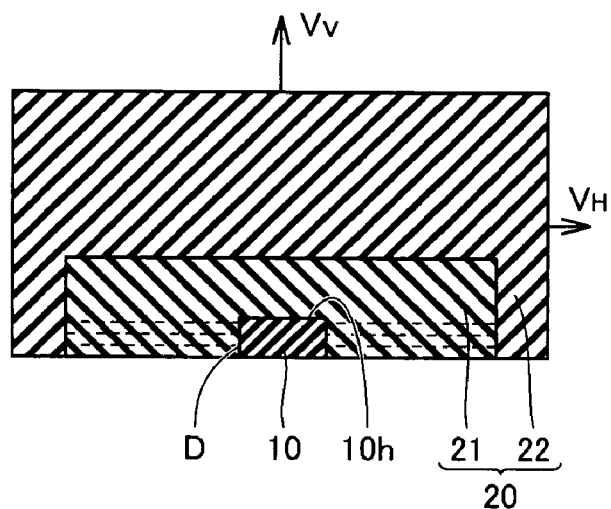
FIG. 2 is a schematic cross sectional view showing the step of growing a second group III-nitride crystal on the first group III-nitride crystal.

Referring to FIGS. 1 and 2, another method of manufacturing a group III-nitride crystal in accordance with the present invention includes the steps of preparing a seed crystal 10, growing a first group III-nitride crystal 21 on seed crystal 10 by liquid phase method, and growing a second group III-nitride crystal 22 on the first group III-nitride crystal 21. Here, as shown in FIG. 1, the step of growing a first group III-nitride crystal 21 on seed crystal 10 is characterized in that the rate of crystal growth $V_H$ in a direction parallel to the main surface 10h of seed crystal 10 is larger than the rate of crystal growth $V_V$ in a direction vertical to the main surface 10h of seed crystal 10. Further, as shown in FIG. 2, the step of growing a second group III-nitride crystal 22 on the first group III-nitride crystal 21 is characterized in that the rate of crystal growth $V_H$ in a direction parallel to the main surface 10h of seed crystal 10 is smaller than the rate of crystal growth $V_V$ in a direction vertical to the main surface 10h of seed crystal 10.

As shown in FIG. 1, in the step of growing the first group III-nitride crystal 21, as $V_H > V_V$, most of the dislocations D on the surface of seed crystal 10 propagate in a direction parallel to the main surface of the seed crystal, and hardly propagate in a direction vertical to the main surface 10h of seed crystal 10. Therefore, in the grown first group III-nitride crystal 21, dislocation density of the surface parallel to the main surface 10h of seed crystal 10 is significantly reduced from the dislocation density of the main surface 10h of seed crystal 10.

Next, as shown in FIG. 2, in the step of growing a second group III-nitride crystal 22 on the first group III-nitride crystal 21, as $V_H < V_V$, most of the dislocations on the surface of first group III-nitride crystal propagate in the direction vertical to the main surface 10h of seed crystal 10, and hardly propagate in a direction parallel to the main surface 10h of seed crystal 10. Further, the dislocation density of the surface parallel to the main surface 10h of seed crystal 10 in the first group III-nitride crystal 21 is significantly decreased as compared with the dislocation density of the surface of the seed crystal. Therefore, when the second group III-nitride crystal grows, there is only a few dislocations that propagate in the direction vertical to the main surface 10a of seed crystal 10. Therefore, the dislocation density of the surface parallel to the main surface of seed crystal in the second group III-nitride crystal is also significantly lower than the dislocation density of the surface of seed crystal.

Here, the first and second group III-nitride crystals are not particularly limited. From the viewpoint of suppressing generation of dislocations, however, group III-nitride crystals of the same type are preferred. When the first group III-nitride crystal and the second group III-nitride crystal are crystals of the same type, the first and second group III-nitride crystals may be handled as one group III-nitride crystal, without distinguishing one from another.

In the present embodiment, the method of performing the step of growing the second group III-nitride crystal on the first group III-nitride crystal is not particularly limited. From the viewpoint of growing a crystal having low dislocation density, however, liquid phase method or gas phase method is preferably used.

Though not limiting, as the liquid phase method, use of the flux method or high nitrogen ($N_2$) pressure solution method is preferred, in order to easily grow the second group III-nitride crystal having low dislocation density taking over the low dislocation density of the first group III-nitride crystal.

As the gas phase method, though not limiting, use of HVPE (Hydride Vapor Phase Epitaxy), MOCVD (Metal Organic Chemical Vapor Deposition) or MPE (Molecular Beam Epitaxy) method is preferred, in order to easily grow the second group III-nitride crystal having low dislocation density taking over the low dislocation density of the first group III-nitride crystal. For fast crystal growth, HVPE method is more preferable.

In the HVPE method, a halide of a group III-element and a nitrogenous material such as ammonia ($NH_3$) are reacted in gas phase, to grow a group III-nitride crystal. When a GaN crystal is to be grown, for example, reaction is caused between $NH_3$ gas and GaCl gas, which is generated by a reaction of metal Ga and hydrogen chloride (HCl). By the HVPE method, the rate of crystal growth can be increased up to about 100 μm/hr, and therefore, a thick group III-nitride crystal can be obtained easily.

Embodiment 3

Figure 3:
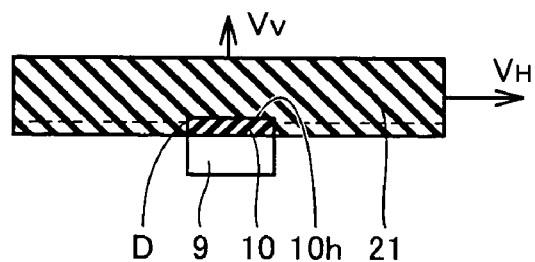
FIG. 3 is a schematic cross sectional view showing the step of growing a first group III-nitride crystal on a group III-nitride seed crystal formed on an underlying substrate.

Referring to FIG. 3, a still another method of manufacturing a group III-nitride crystal in accordance with the present invention includes the steps of preparing, as seed crystal 10, a group III-nitride crystal formed on an underlying substrate 9, growing a first group III-nitride crystal 21 on seed crystal 10 by liquid phase method, and the step of growing a first group III-nitride crystal 21 on seed crystal 10 is characterized in that the rate of crystal growth $V_H$ in a direction parallel to the main surface 10h of seed crystal 10 is larger than the rate of crystal growth $V_V$ in a direction vertical to the main surface 10h of seed crystal 10.

The present embodiment is characterized in that, as shown in FIG. 3, a group III-nitride crystal formed on underlying substrate 9 is used as the seed crystal. The group III-nitride seed crystal of the present embodiment is formed thin on underlying substrate 9, and the area of a surface vertical to the main surface of seed crystal is very small. Therefore, there is only a few dislocations on the surface vertical to the main surface of the seed crystal. Accordingly, though dislocations of the surface vertical to the main surface of seed crystal propagates in a direction parallel to the main surface of seed crystal when the first group III-nitride crystal grows under the condition of $V_H>V_V$, such dislocations themselves are small in number, and hence, the number of propagated dislocations is very small. Under the growth condition of $V_H>V_V$, dislocations of the seed crystal hardly propagate in the direction vertical to the main surface of the seed crystal. Therefore, by using a thin group III-nitride seed crystal formed on the underlying substrate, dislocation density of the grown group III-nitride crystal can further be reduced.

Though not limiting, as the underlying substrate, a sapphire substrate, an SiC substrate or the like is used preferably, from the viewpoint of growing a crystal in a direction parallel to the main surface of the seed crystal only from the portion of group III-nitride seed crystal formed on the underlying substrate. Further, thickness of the group III-nitride seed crystal should preferably be at most 100 μm, and more preferably, at most 10 μm, in order to reduce dislocation density. Here, the group III-nitride seed crystal is not particularly limited. From the viewpoint of suppressing generation of dislocations, however, crystal of the same type as the group III-nitride crystal to be grown is preferred. The method of forming a group III-nitride seed crystal on the underlying substrate is not particularly limited, either. However, from the viewpoint of easily growing a thin group III-nitride seed crystal having low dislocation density, MOCVD method, MBE method or HVPE method is preferred.

Embodiment 4

A still another method of manufacturing a group III-nitride crystal in accordance with the present invention includes the steps of preparing, as a seed crystal, a group III-nitride seed crystal formed on an underlying substrate, growing a first group III-nitride crystal on the seed crystal by liquid phase method, and growing a second group III-nitride crystal on the first group III-nitride crystal. Here, as shown in FIG. 3, the step of growing a first group III-nitride crystal 21 on the group III-nitride seed crystal as seed crystal 10 is characterized in that the rate of crystal growth $V_H$ in a direction parallel to the main surface 10h of seed crystal 10 is larger than the rate of crystal growth $V_V$ in a direction vertical to the main surface 10h of seed crystal 10. Though not shown, the step of growing a second group III-nitride crystal on the first group III-nitride crystal is characterized in that the rate of crystal growth $V_H$ in a direction parallel to the main surface of the seed crystal is smaller than the rate of crystal growth $V_V$ in a direction vertical to the main surface of the seed crystal.

In the present embodiment, the step of growing the first group III-nitride crystal on the seed crystal of Embodiment 2 is modified to the step of Embodiment 3, and as is apparent from the descriptions of Embodiments 2 and 3, the dislocation density of the surface parallel to the main surface of the seed crystal in the second group III-nitride crystal can further be reduced.

In Embodiments 1 to 4 described above, from the viewpoint of easily obtaining a large group III-nitride crystal using a group III-nitride crystal as a seed crystal, the main surface of the seed crystal should preferably be the {0001} plane. Here, the {0001} plane generally refers to symmetrically equivalent planes, and includes (0001) plane and (000-1) plane.

Embodiment 5

A group III-nitride crystal of the present invention is manufactured by any of the manufacturing methods in accordance with Embodiments 1 to 4 described above, and the group III-nitride crystal has dislocation density of the surface parallel to the main surface of the seed crystal of at most $5\times10^6$/$cm^2$ and preferably, $1\times10^6/cm^2$. By the manufacturing method described above, a group III-nitride crystal having low dislocation density in the plane parallel to the main surface of the seed crystal can be obtained. Here, dislocation density of a crystal can be measured using a TEM (Transmission Electron Microscope).

Embodiment 6

Figure 6:
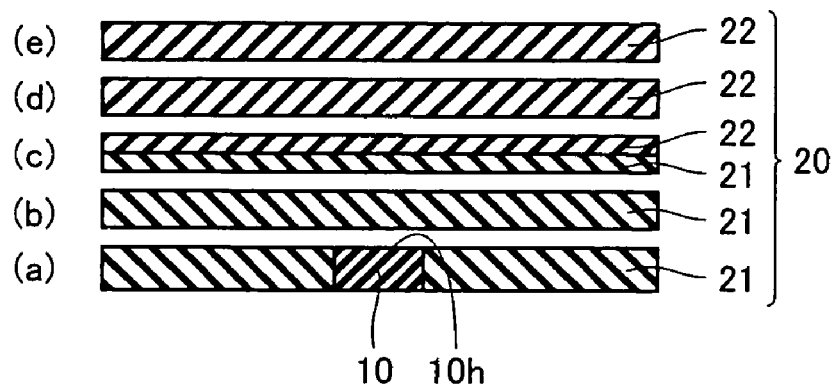
FIG. 6 includes schematic cross sectional views representing the step of manufacturing group III-nitride crystal substrates from group III-nitride crystals, in which (a) shows a substrate consisting of a seed crystal and a first group III-nitride crystal, (b) shows a substrate consisting of the first group III-nitride crystal, (c) shows a substrate consisting of first and second group III-nitride crystals, and (d) and (e) show substrates consisting of the second group III-nitride crystal.

A group III-nitride crystal substrate of the present invention is a group III-nitride crystal substrate having main surface dislocation density of at most $5 \times 10^6/cm^2$ and preferably, $1 \times 10^6/cm^2$ obtained from the group III-nitride crystal described above. Specifically, as shown in FIG. 6, for example, on a group III-nitride seed crystal as seed crystal 10, a group III-nitride crystal 20 of the same type (including the first group III-nitride crystal 21 and the second group III-nitride crystal 22) is grown, and thereafter, the group III-nitride crystal 20 is cut in parallel with the main surface 10h of seed crystal 10 and the surface is polished, whereby the group III-nitride crystal substrate of the present invention is obtained. Here, for cutting the crystal, inner peripheral edge, outer peripheral edge or a laser may be used. For polishing the crystal surface, various methods of polishing such as mechanical polishing, chemical mechanical polishing (CMP) and etching may be used.

In FIG. 6, the substrate of FIG. 6(b) is formed of the first group III-nitride crystal, the substrate of FIG. 6(c) is formed of the first and second group III-nitride crystals, and the substrates of FIGS. 6(d) and (e) are formed of the second group III-nitride crystal, and any of the substrates can be used as a substrate for a semiconductor device.

Embodiment 7

Figure 7:
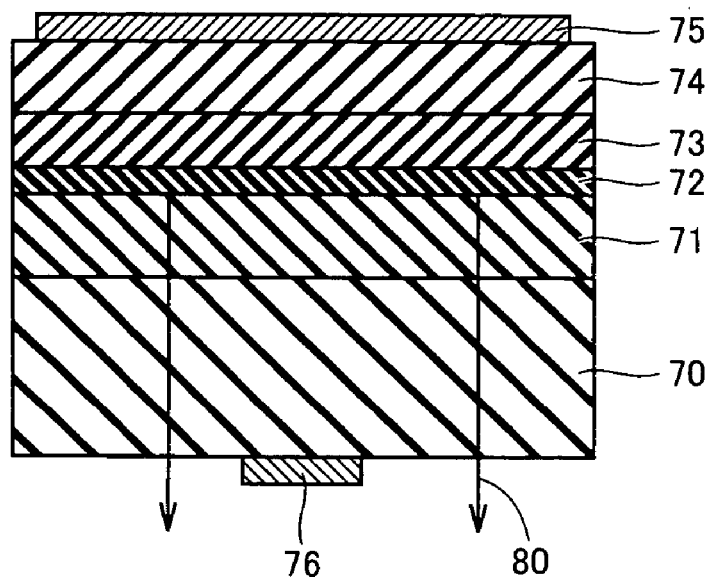
FIG. 7 is a schematic cross sectional view representing a semiconductor device in accordance with the present invention.

A semiconductor device of the present invention is a semiconductor device having at least one layer of group III-nitride crystal semiconductor layer formed on a main surface of the group III-nitride crystal substrate described above. Referring to FIG. 7, as an example of the semiconductor device of the present invention, on a main surface of a GaN crystal substrate 70 as the group III-nitride crystal substrate, by MOCVD method, an n type GaN layer 71 is formed as a group III-nitride crystal layer, a multiple quantum well structure 72 having one or more pairs of $In_{0.15}Ga_{0.85}N$ layer and GaN layer stacked, a p type $Al_{0.20}Ga_{0.80}N$ layer 73 and a p type GaN layer 74 are formed successively, an n-side electrode 76 is formed on the lower side of the GaN substrate and a p-side electrode 75 is formed on an upper side of p type GaN layer 74, whereby an LED (Light Emitting Diode) emitting light 80 is provided. The LED in accordance with the present invention employs a group III-nitride crystal substrate having low dislocation density of the main surface, and therefore, it attains high emission intensity.

Experiments
(Experiment 1)

Figure 4:
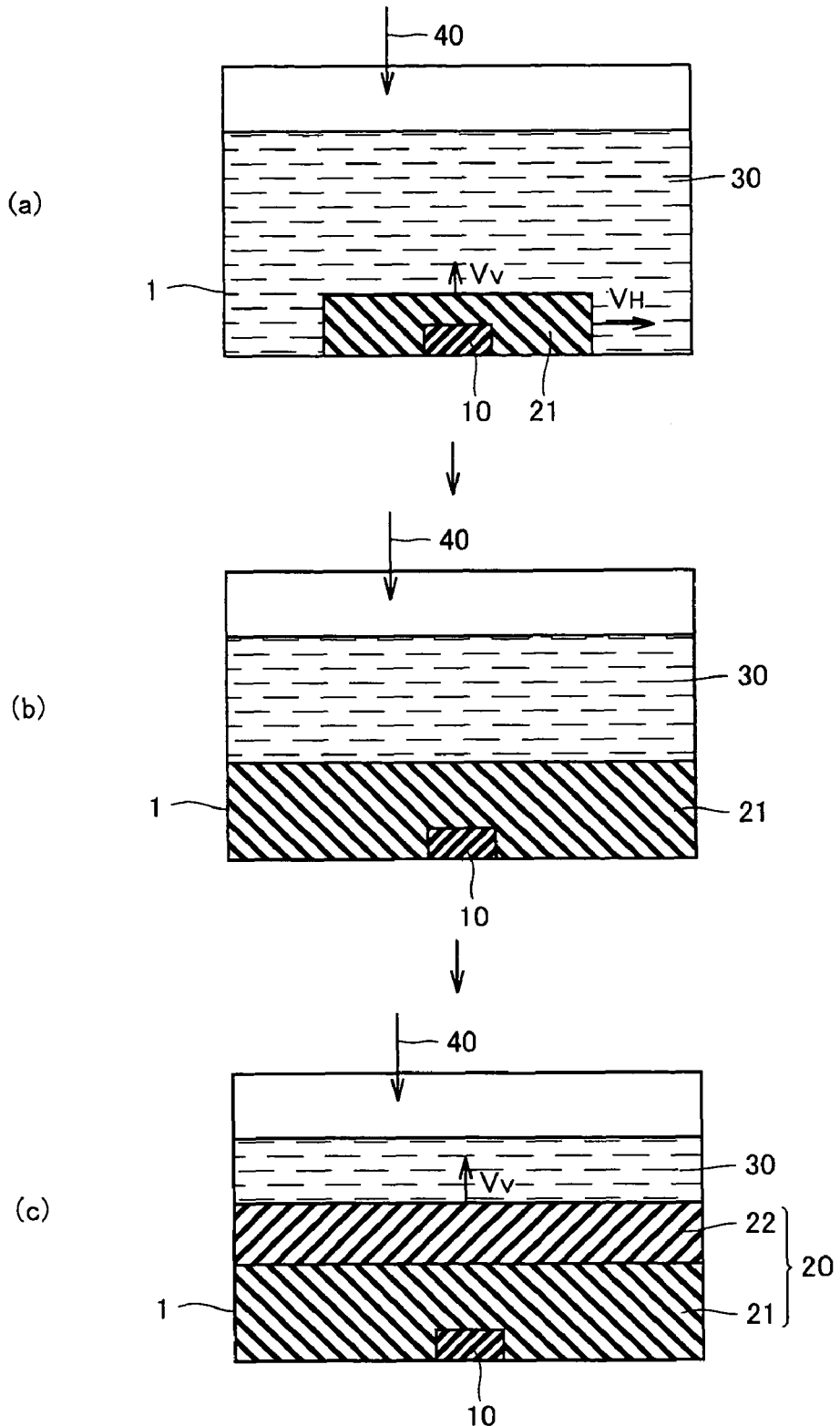
FIG. 4 includes schematic cross sectional views representing an embodiment of the method of manufacturing a group III-nitride crystal in accordance with the present invention, in which (a) shows a state in which a first group III-nitride crystal grows on a seed crystal, (b) shows a state in which growth of the first group III-nitride crystal is completed and growth of a second group III-nitride crystal starts, and (c) shows a state in which the second group III-nitride crystal grows on the first group III-nitride crystal.

Referring to FIG. 4(a) of FIG. 4, first, using a GaN seed crystal (dislocation density: $5 \times 10^7/cm^2$, size: 3 mm in diameter $\times$ 400 μm in thickness) as a seed crystal 10, a first GaN crystal as the first group III-nitride crystal was grown such that the rate of crystal growth $V_H$ in the direction parallel to the (0001) plane as a main surface 10h (disk surface of 3 mm in diameter) of seed crystal 10 was larger than the rate of crystal growth $V_V$ in the direction vertical to the main surface 10h of seed crystal 10, by the flux method.

Specifically, in an alumina crucible having the inner diameter of 17 mm $\times$ height of 50 mm as a reaction vessel 1, the GaN seed crystal described above was placed such that its main surface 10h, that is, (0001) plane, faces upward in parallel with the bottom surface of the alumina crucible. Thereafter, metal Ga of 4 g and metal Na (Na flux) of 3.52 g were put in the alumina crucible and heated, so that Ga—Na melt was formed as melt 30 around the GaN seed crystal. Thereafter, interface temperature between the crystal (including the GaN seed crystal and the GaN crystal to be grown) and melt 30 was set to 850° C., an $N_2$ gas was introduced to the alumina crucible as a nitrogen raw material gas 40, $N_2$ gas pressure was set to 3.039 MPa (30 atm), and the first GaN crystal was grown for 200 hr (hours, same in the following). As for the rate of crystal growth of the first GaN crystal, $V_H$ was 35 μm/hr and $V_V$ was 8 μm/hr. Dislocation density of (0001) plane (corresponding to a plane parallel to (0001) plane as the main surface of GaN seed crystal) of thus obtained first GaN crystal having the diameter of 17 mm $\times$ height of 1600 μm was measured by TEM, which was $3 \times 10^5/cm^2$ and significantly reduced from the dislocation density of the seed crystal.

In the present experiment, the direction of crystal growth was controlled by adjusting the size of alumina crucible. Specifically, when a surface of the GaN crystal growing at the rates of $V_H > V_V$ vertical to the main surface of the GaN seed crystal is in contact with the alumina crucible as shown in FIG. 4(b), the GaN crystal cannot grow in the direction parallel to the main surface of the GaN seed crystal.

In the state described above, when the GaN crystal was further grown, the crystal grew only in the direction vertical to the main surface of the GaN seed crystal, as shown in FIG. 4(c). Namely, the crystal grew as the second GaN crystal ($V_H < V_V$), that is, the second group III-nitride crystal of the present invention. As for the rate of crystal growth of the second GaN crystal, $V_H$ was 0 μm/hr and $V_V$ was 10 μm/hr. Crystal growth was continued for 150 hr, to obtain the second GaN crystal having the diameter of 17 mm $\times$ thickness of 1500 μm. In this manner, a GaN crystal having the diameter of 17 mm $\times$ thickness of 3100 μm consisting of the first and second GaN crystals integrated as one body, was obtained. After the growth of the second GaN crystal, dislocation density of (0001) plane of the GaN crystal was measured by TEM, which was further reduced to $1 \times 10^5/cm^2$.

Further, the first and second GaN crystals 21 and 22 were cut as the group III-nitride crystal substrates, as shown in FIG. 6, such that the main surfaces of the GaN crystals were made parallel to the main surface 10h of the seed crystal 10, and the surfaces were polished to obtain GaN crystal substrates of 10 mm $\times$ 10 mm $\times$ 400 μm in thickness.

Thereafter, referring to FIG. 7, on the (0001) plane as the main surface of GaN crystal substrate 70, an n type GaN layer 71 having the thickness of 2 μm, a multiple quantum well structure 72 having three pairs of $In_{0.15}Ga_{0.85}N$ layer of 3 nm and GaN layer of 15 nm stacked, a p type $Al_{0.20}Ga_{0.80}N$ layer 73 having the thickness of 20 nm and a p type GaN layer 74 having the thickness of 100 nm were formed successively by MOCVD method. At a central portion on the lower surface of GaN substrate, an n-side electrode 76 of 50 μm in diameter was formed and a p-side electrode 75 was formed on an upper surface of p type GaN layer 74, whereby an LED was obtained. Here, the n type dopant was Si and p type dopant was Mg. Relative emission intensity when a current of 20 mA was caused to flow between both electrodes of the LED was 1.8 in the case of a GaN crystal substrate formed only of the first GaN crystal and 2.5 in the case of a GaN crystal substrate formed only of the second GaN crystal, improved from the emission intensity of 1.0 of the LED of Comparative Example 1, which will be described later. The emission intensity of the LED device was measured by a spectrophotometer. The results are as shown in Table 1.

(Experiment 2)

Figure 5:
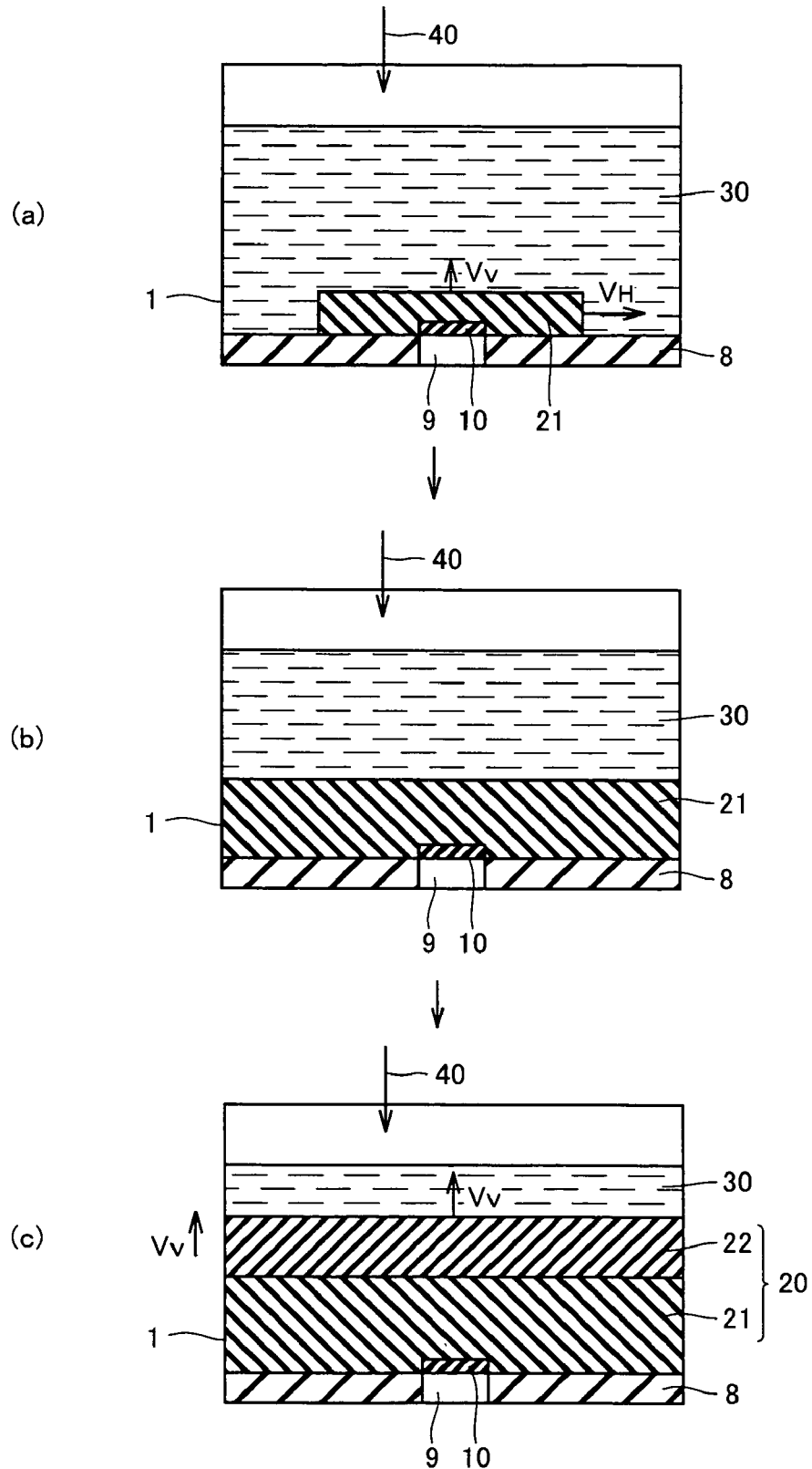
FIG. 5 includes schematic cross sectional views representing another embodiment of the method of manufacturing a group III-nitride crystal in accordance with the present invention, in which (a) shows a state in which a first group III-nitride crystal grows on a seed crystal, (b) shows a state in which growth of the first group III-nitride crystal is completed and growth of a second group III-nitride crystal starts, and (c) shows a state in which the second group III-nitride crystal grows on the first group III-nitride crystal.

Referring to FIG. 5(a) of FIG. 5, a GaN crystal (including the first and second GaN crystals) was grown in the similar manner as Experiment 1, except that the GaN crystal was grown only on the GaN seed crystal by the flux method using the GaN seed crystal (dislocation density: $1\times10^9/cm^2$, size: 3 mm in diameter×3 μm in thickness) formed by the MOCVD method on a sapphire substrate having the diameter of 3 mm and thickness of 400 μm as the underlying substrate 9, as the seed crystal 10. In order to support the thin first GaN crystal at the time of crystal growth, a support base 8 having the same thickness as underlying substrate 9 was provided in reaction vessel 1. The dislocation density of the (0001) plane of the obtained GaN crystal was $2\times10^5/cm^2$ after the growth of the first GaN crystal, and $1\times10^5/cm^2$ after the growth of the second GaN crystal, and much reduced from the dislocation density ($1\times10^9/cm^2$) of the GaN seed crystal.

In the similar manner as in Experiment 1, GaN crystal substrates and LEDs were formed from the GaN crystal. Relative emission intensity when a current of 20 mA was caused to flow between both electrodes of the LED was 2.0 in the case of a GaN crystal substrate formed only of the first GaN crystal and 2.5 in the case of a GaN crystal substrate formed only of the second GaN crystal, improved from the emission intensity of 1.0 of the LED of Comparative Example 1, which will be described later. The results are as shown in Table 1.

(Experiment 3)

Referring to FIG. 4, GaN crystal, GaN crystal substrates and LEDs were formed in the similar manner as in Experiment 1 except that an AlN seed crystal (dislocation density: $1\times10^9/cm^2$, size: 3 mm in diameter×400 μm in thickness) was used as the seed crystal 10. The dislocation density of the (0001) plane of the obtained GaN crystal was $5\times10^5/cm^2$ after the growth of the first GaN crystal, and $3\times10^5/cm^2$ after the growth of the second GaN crystal, and much reduced from the dislocation density ($1\times10^9/cm^2$) of the AlN seed crystal. Further, relative emission intensity when a current of 20 mA was caused to flow between both electrodes of the LED was 1.5 in the case of a GaN crystal substrate formed only of the first GaN crystal and 1.8 in the case of a GaN crystal substrate formed only of the second GaN crystal, improved from the emission intensity of 1.0 of the LED of Comparative Example 1, which will be described later. The results are as shown in Table 1.

(Experiment 4)

Referring to (a) and (b) of FIG. 4, in the similar manner as in Experiment 1, the first GaN crystal was grown on the GaN seed crystal by the flux method, and thereafter, the first GaN crystal was taken out and the second GaN crystal was grown on the first GaN crystal by the HVPE method. Specifically, to the first GaN crystal, GaCl gas (Ga raw material gas), $NH_3$ gas (nitrogen raw material gas) and $H_2$ gas (carrier gas) were introduced (with molar ratio of $GaCl:NH_3:H_2=120:1000:7000$) at the total gas flow rate of 8120 sccm (1 sccm represents gas flow rate of 1 $cm^3$ per one minute, of the gas in the standard state (1013 hPa, 0° C.)), for 30 hr at 1030° C., 101 kPa, whereby the second GaN crystal having the diameter of 17 mm×thickness of 3000 μm was grown. As for the rate of crystal growth of the second GaN crystal, $V_H$ was 0 μm/hr and $V_V$ was 100 μm/hr. In this manner, a GaN crystal having the first and second GaN crystals integrated as one body was obtained. From the GaN crystal, the GaN crystal substrates and LEDs were formed in the similar manner as in Experiment 1.

The dislocation density of the (0001) plane of the obtained GaN crystal was $3\times10^5/cm^2$ after the growth of the first GaN crystal, and $1\times10^5/cm^2$ after the growth of the second GaN crystal, and much reduced from the dislocation density ($5\times10^7/cm^2$) of the GaN seed crystal. Further, relative emission intensity when a current of 20 mA was caused to flow between both electrodes of the LED was 1.7 in the case of a GaN crystal substrate formed only of the first GaN crystal and 2.5 in the case of a GaN crystal substrate formed only of the second GaN crystal, improved from the emission intensity of 1.0 of the LED of Comparative Example 1, which will be described later. The results are as shown in Table 1.

(Experiment 5)

A GaN crystal (including the first and second GaN crystals) was grown in the similar manner as Experiment 4, except that the GaN crystal was grown only on the GaN seed crystal by the flux method using the GaN seed crystal (dislocation density: $1\times10^9/cm^2$, size: 3 mm in diameter×3 μm in thickness) formed by the MOCVD method on a sapphire substrate having the diameter of 3 mm and thickness of 400 μm as the underlying substrate, as the seed crystal. The dislocation density of the (0001) plane of the obtained GaN crystal was $2\times10^5/cm^2$ after the growth of the first GaN crystal, and $1\times10^5/cm^2$ after the growth of the second GaN crystal, and much reduced from the dislocation density ($1\times10^9/cm^2$) of the GaN seed crystal.

In the similar manner as in Experiment 4, GaN crystal substrates and LEDs were formed from the GaN crystal. Relative emission intensity when a current of 20 mA was caused to flow between both electrodes of the LED was 2.1 in the case of a GaN crystal substrate formed only of the first GaN crystal and 2.5 in the case of a GaN crystal substrate formed only of the second GaN crystal, improved from the emission intensity of 1.0 of the LED of Comparative Example 1, which will be described later. The results are as shown in Table 1.

(Experiment 6)

A GaN crystal, GaN crystal substrates and LEDs were formed in the similar manner as in Experiment 4 except that an AlN seed crystal (dislocation density: $1\times10^9/cm^2$, size: 3 mm in diameter×400 μm in thickness) was used as the seed crystal. The dislocation density of the (0001) plane of the obtained GaN crystal was $5\times10^5/cm^2$ after the growth of the first GaN crystal, and $3\times10^5/cm^2$ after the growth of the second GaN crystal, and much reduced from the dislocation density ($1\times10^9/cm^2$) of the AlN seed crystal. Further, relative emission intensity when a current of 20 mA was caused to flow between both electrodes of the LED was 1.5 in the case of a GaN crystal substrate formed only of the first GaN crystal and 1.8 in the case of a GaN crystal substrate formed only of the second GaN crystal, improved from the emission intensity of 1.0 of the LED of Comparative Example 1, which will be described later. The results are as shown in Table 1.

Comparative Example 1

Using a GaN seed crystal (dislocation density: $5\times10^7/cm^2$, size: 17 mm in diameter×400 μm in thickness) as seed crystal 10, a GaN crystal as the group III-nitride crystal was grown in the direction vertical to the (0001) plane, that is, the main surface 10h (disk surface having the diameter of 17 mm) of seed crystal 10.

Specifically, to the GaN seed crystal, GaCl gas (Ga raw material gas), $NH_3$ gas (nitrogen raw material gas) and $H_2$ gas (carrier gas) were introduced (with molar ratio of $GaCl:NH_3:H_2=120:1000:7000$) at the total gas flow rate of 8120 sccm (1 sccm represents gas flow rate of 1 $cm^3$ per one minutes, of the gas in the standard state (1013 hPa, 0° C.)), for 30 hr at 1030° C., 101 kPa, whereby the GaN crystal having the diameter of 17 mm×thickness of 3000 μm was grown. As for the rate of crystal growth of the GaN crystal, $V_H$ was 0 μm/hr and $V_V$ was 100 μm/hr. Dislocation density of the (0001) plane of the obtained GaN crystal was $3×10^7/cm^2$.

Further, in the similar manner as in Experiment 1, GaN crystal substrates and LEDs were formed from the GaN crystal. Emission intensity when a current of 20 mA was caused to flow between both electrodes of the LED was considered to be 1.0, and relative emission intensities of Experiments 1 to 6 above were calculated.

TABLE 1

| | | Ex. 1 | Ex. 2 | Ex. 3 | Ex. 4 | Ex. 5 | Ex. 6 | Com. Ex. 1 |
|---|---|---|---|---|---|---|---|---|
| Seed Crystal | composition/structure | GaN | GaN/sapphire | AlN | GaN | GaN/sapphire | AlN | GaN |
| | dislocation density/cm² | $5 × 10^7$ | $1 × 10^9$ | $1 × 10^9$ | $5 × 10^7$ | $1 × 10^9$ | $1 × 10^9$ | $5 × 10^7$ |
| 1st GaN Crystal | method of growth | flux | flux | flux | flux | flux | flux | |
| | $V_H$ (μm/hr) | 35 | 35 | 35 | 35 | 35 | 35 | |
| | $V_V$ (μm/hr) | 8 | 8 | 8 | 8 | 8 | 8 | |
| | dislocation density/cm² | $3 × 10^5$ | $2 × 10^5$ | $5 × 10^5$ | $3 × 10^5$ | $2 × 10^5$ | $5 × 10^5$ | |
| 2nd GaN Crystal | method of growth | flux | flux | flux | HVPE | HVPE | HVPE | HVPE |
| | $V_H$ (μm/hr) | 0 | 0 | 0 | 0 | 0 | 0 | 0 |
| | $V_V$ (μm/hr) | 10 | 10 | 10 | 100 | 100 | 100 | 100 |
| | dislocation density/cm² | $1 × 10^5$ | $1 × 10^5$ | $3 × 10^5$ | $1 × 10^5$ | $1 × 10^5$ | $3 × 10^5$ | $3 × 10^7$ |
| LED Relative emission intensity | 1st GaN crystal substrate | 1.8 | 2.0 | 1.5 | 1.7 | 2.1 | 1.5 | 1.0 |
| | 2nd GaN crystal substrate | 2.5 | 2.5 | 1.8 | 2.5 | 2.5 | 1.8 | |

In Table 1, as is apparent from the comparison between Experiments 1 to 6 and Comparative Example 1, in the step of growing the first group III-nitride crystal (first GaN crystal) on the group III-nitride seed crystal (GaN seed crystal or AlN seed crystal) by the flux method, by setting higher the rate of crystal growth $V_H$ in the direction parallel to the main surface (for example, (0001) plane) of the group III-nitride seed crystal than the rate of crystal growth $V_V$ in the direction vertical to the main surface of the seed crystal, a group III-nitride crystal having lower dislocation density at the main surface of the group III-nitride seed crystal could be obtained.

Particularly, as indicated in Experiments 2 and 5, when the above-described first GaN crystal was grown using a seed crystal of which surface vertical to the main surface had a small area such as the group III-nitride seed crystal formed on the underlying layer, a group III-nitride crystal having very low dislocation density on the main surface of the group III-nitride seed crystal could be obtained.

As a result, the LED as a semiconductor device using the group III-nitride crystal substrate obtained from the group III-nitride crystal described above came to have higher emission intensity than the LED using a conventional group III-nitride crystal substrate.

The embodiments and experiments as have been described here are mere examples and should not be interpreted as restrictive. The scope of the present invention is determined by each of the claims with appropriate consideration of the written description of the embodiments and embraces modifications within the meaning of, and equivalent to, the languages in the claims.

INDUSTRIAL APPLICABILITY

As described above, the present invention is widely applicable to the group III-nitride crystal having low dislocation density and manufacturing method thereof. Further, the group III-nitride crystal obtained in accordance with the present invention is widely applicable as the group III-nitride crystal substrate for a semiconductor device.

The invention claimed is:

1. A method of manufacturing a group III-nitride crystal, the method comprising steps of:
   preparing a seed crystal which has a main lateral surface and vertical side surfaces;
   growing a first group III-nitride crystal on the main lateral surface and the vertical side surfaces of said seed crystal by liquid phase method; and
   growing a second group III-nitride crystal on said first group III-nitride crystal by either a hydride vapor phase epitaxy method, a flux method or a high nitrogen pressure solution method with said first group III-nitride crystal in contact with a crucible,
   wherein in said step of growing the first group III-nitride crystal on the main lateral surface and the vertical side surfaces of said seed crystal, rate of crystal growth in a direction parallel to the main lateral surface of said seed crystal is higher than rate of crystal growth in a direction vertical to the main lateral surface of said seed crystal and
   wherein in said step of growing the second group III-nitride crystal on said first group III-nitride crystal, rate of crystal growth in the direction parallel to the main lateral surface of said seed crystal is lower than rate of crystal growth in the direction vertical to the main lateral surface of said seed crystal.

2. The method of manufacturing a group III-nitride crystal according to claim 1, wherein
   said seed crystal is a group III-nitride seed crystal.

3. The method of manufacturing a group III-nitride crystal according to claim 2, wherein
   the main lateral surface of said group III-nitride seed crystal is a {0001} plane.

4. The method of manufacturing a group III-nitride crystal according to claim 1, wherein
   said seed crystal is a group III-nitride seed crystal formed on an underlying substrate.

5. The method of manufacturing a group III-nitride crystal according to claim 4, wherein the main lateral surface of said group III-nitride seed crystal is a {0001} plane.

6. A method of manufacturing a group III-nitride crystal, the method comprising steps of:
    preparing a seed crystal which has a main lateral surface and vertical side surfaces;
    growing a first group III-nitride crystal on the main lateral surface and the vertical side surfaces of said seed crystal by liquid phase method to extend beyond a peripheral edge of said seed crystal; and
    growing a second group III-nitride crystal mainly on a crystal region of said first group III-nitride crystal that has been grown beyond the peripheral edge of said seed crystal.

* * * * *